United States Patent
Lo et al.

(10) Patent No.: US 8,048,599 B2
(45) Date of Patent: Nov. 1, 2011

(54) COLOR FILTER AND METHOD OF FABRICATING THE SAME

(75) Inventors: Yu-Cheng Lo, Taipei County (TW); Pei-Yu Liu, Taipei (TW); Jiun-Ming Wang, Changhua County (TW); Huai-An Li, Chung-Li (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 382 days.

(21) Appl. No.: 12/372,744

(22) Filed: Feb. 18, 2009

(65) Prior Publication Data
US 2009/0239163 A1    Sep. 24, 2009

(30) Foreign Application Priority Data
Mar. 19, 2008 (TW) ............................... 97109625 A

(51) Int. Cl.
*G02B 5/20* (2006.01)
(52) U.S. Cl. ............................. 430/7; 347/106; 347/107
(58) Field of Classification Search .................. None
See application file for complete search history.

(56) References Cited

U.S. PATENT DOCUMENTS
5,712,064 A * 1/1998 Miyazaki et al. ............... 430/7

FOREIGN PATENT DOCUMENTS
JP    49-066023 A * 6/1974
JP    2000171628    6/2000

OTHER PUBLICATIONS
English-language abstract of JP 49-066023 (Jun. 1974).*
* cited by examiner

*Primary Examiner* — John A. McPherson
(74) *Attorney, Agent, or Firm* — Winston Hsu; Scott Margo

(57) ABSTRACT

A color filter fabricated by an ink jet process is disclosed. The color filter includes a substrate, a plurality of pixel regions positioned on the surface of the substrate, and a plurality of colored photoresists. Each pixel region includes a plurality of sub-pixel regions, and each colored photoresist is positioned in each sub-pixel region. The colored photoresists include a plurality of hydrophile photoresists and a plurality of hydrophobic photoresists. The hydrophile photoresists and the hydrophobic photoresists are alternately arranged to prevent an overflow of the colored photoresists.

23 Claims, 18 Drawing Sheets

COLOR FILTER AND METHOD OF FABRICATING THE SAME

BACKGROUND OF THE INVENTION

1. Field of the Invention

The present invention relates to a color filter and the related fabricating method, and more particularly, to a color filter applied to a color display device and the related fabricating method.

2. Description of the Prior Art

Due to continued development and advancement in electrical technology, the variety of applications as well as the demand for liquid crystal displays is ever increasing. A liquid crystal display (LCD) is one type of flat panel display and is employed extensively in applications ranging from small-scale products, such as a digital watch, to various portable electronic devices such as PDAs and notebooks, and even to commercial large panel displays. Since an LCD has the advantages of lightweight, low energy consumption, and free of radiation emission, the LCD is extensively applied to informational products and has a great potential for the future. Taking a thin film transistor liquid crystal display (TFT-LCD) as an instance, the TFT-LCD basically includes a thin film transistor (TFT) substrate, a color filter (CF) substrate, and a liquid crystal layer disposed between the TFT substrate and the CF substrate.

In the traditional process of manufacturing a TFT-LCD, the method of fabricating a color filter mainly includes the following three steps: spin coating the photoresist slurries having three primary colors, red (R), green (G) and blue (B); exposing; and developing. However, the remaining photoresist slurries is only about 1%-2% of the total provided photoresist slurries in the traditional method of fabricating the color filter. About 90% of the total photoresist slurry is flung out in the spin coating process, and then about 70% of the remaining photoresist slurry is removed in the developing process. In addition, a procedure, which includes a coating step, a pre-baking step, an exposing step and a developing step, can only form photoresists with a single color. In other words, it takes three procedures, which includes three coating steps, three pre-baking steps, three exposing steps and three developing steps, to form photoresists with three colors, and therefore the process is complicated and is a high-power consumer. Due to these problems, an ink-jet process is poised to replace the traditional spin coating process for fabricating color filters.

Please refer to FIG. 1, which is a schematic diagram illustrating a conventional method of fabricating a color filter by an ink-jet process. As shown in FIG. 1, a glass substrate 26 is first provided, and the needed color filter pattern is next formed on the glass substrate 26 by utilizing ink-jet equipment 20. The ink-jet equipment 20 includes at least an ink-jet nozzle (also named as nozzle in the following description) 22 and a control device (not shown in the drawings). The glass substrate 26 includes a black matrix pattern (BM pattern) 28 as a shelter from improper reflecting light beams or improper refracting light beams. Subsequently, photoresist slurries 24 directly jet out of the nozzle 22 to the glass substrate 26. Thus, photoresist slurries 24 with different colors jet to the predetermined vacant spaces in the black matrix pattern 28 respectively according to the different processes or the different product requirements. After the photoresist slurries with different colors are jetted onto the glass substrate 26, a curing process is performed on the photoresist slurries 24 to form a stable colored photoresist, and a color filter 10 is therefore fabricated.

However, overflows of the photoresist slurries 24 exist in the conventional ink-jet process. As shown in FIG. 2, when the red photoresist slurries 25R are jetted in a second ink-jet process after the blue photoresist slurries 25B are jetted in a first ink-jet process, the red photoresist slurries 25R overflow toward the blue photoresist slurries 25B. Thus, the photoresist slurries of different colors interblend with each other. The fabricated color filter 10 therefore has problems of disordered hues, and displays adopting this color filter 10 have a serious color shift problem.

SUMMARY OF THE INVENTION

It is an objective of the present invention to provide an improved method of fabricating a color filter and the related color filter, to solve the overflow problem.

According to a preferred embodiment of the present invention, the color filter includes a substrate, a plurality of pixel regions disposed on a surface of the substrate, and a plurality of colored photoresists. Each of the pixel regions includes a plurality of sub-pixel regions, and each colored photoresist is disposed in each pixel regions respectively. The colored photoresist includes a plurality of hydrophilic photoresists and a plurality of hydrophobic photoresists, wherein the hydrophilic photoresists and the hydrophobic photoresists are alternately arranged.

According to another preferred embodiment of the present invention, another method of fabricating a color filter is disclosed. First, a substrate is provided. The substrate includes a plurality of pixel regions thereon, and each pixel region includes a plurality of sub-pixel regions. Subsequently, a colored photoresist is formed in each pixel region. The colored photoresists include a plurality of hydrophilic photoresists and a plurality of hydrophobic photoresists, wherein the hydrophilic photoresists and the hydrophobic photoresists are alternately arranged.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
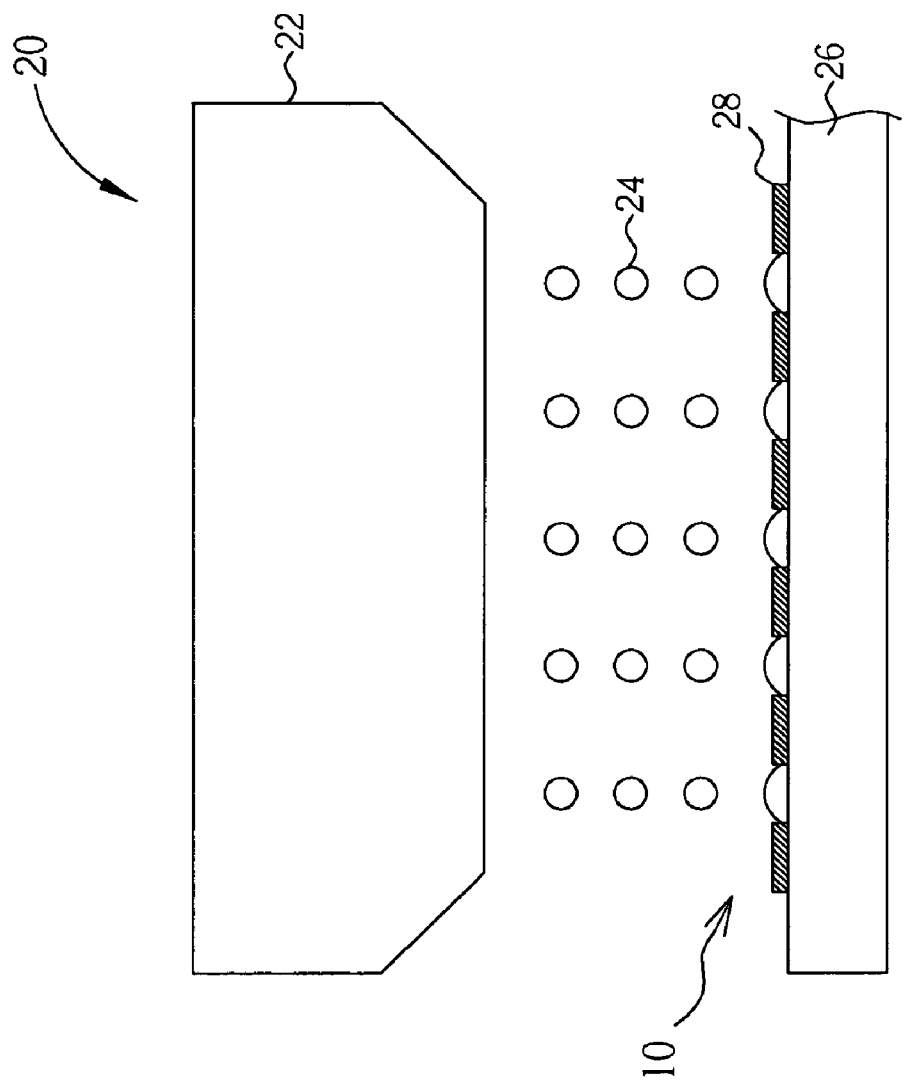
FIG. 1 is a schematic diagram illustrating a conventional method of fabricating a color filter by an ink-jet process.
Figure 2:
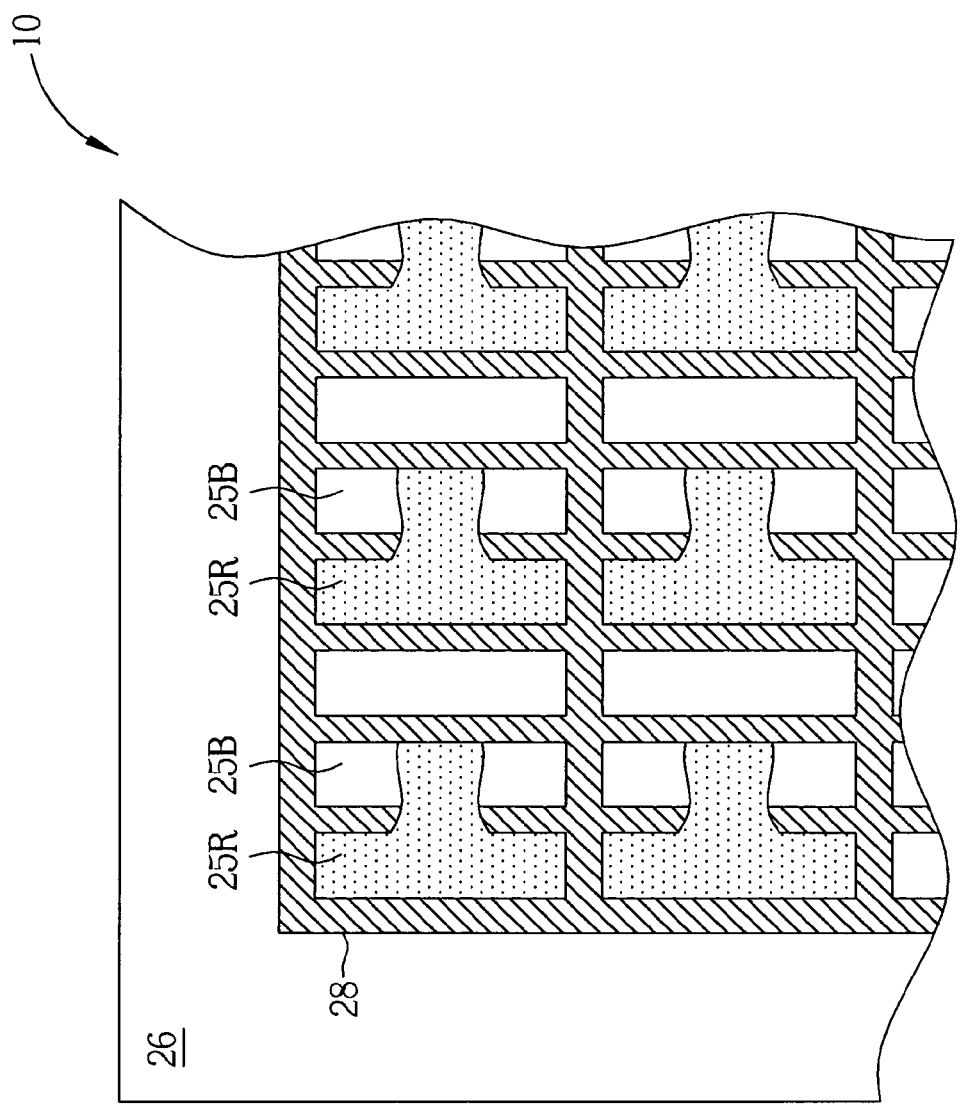
FIG. 2 is a schematic diagram illustrating overflows according to a conventional color filter.
Figure 3:
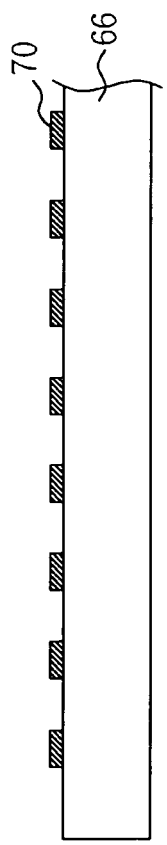
FIG. 3 through FIG. 8 are schematic diagrams illustrating a method of fabricating a color filter according to the first preferred embodiment of the present invention.
Figure 4:
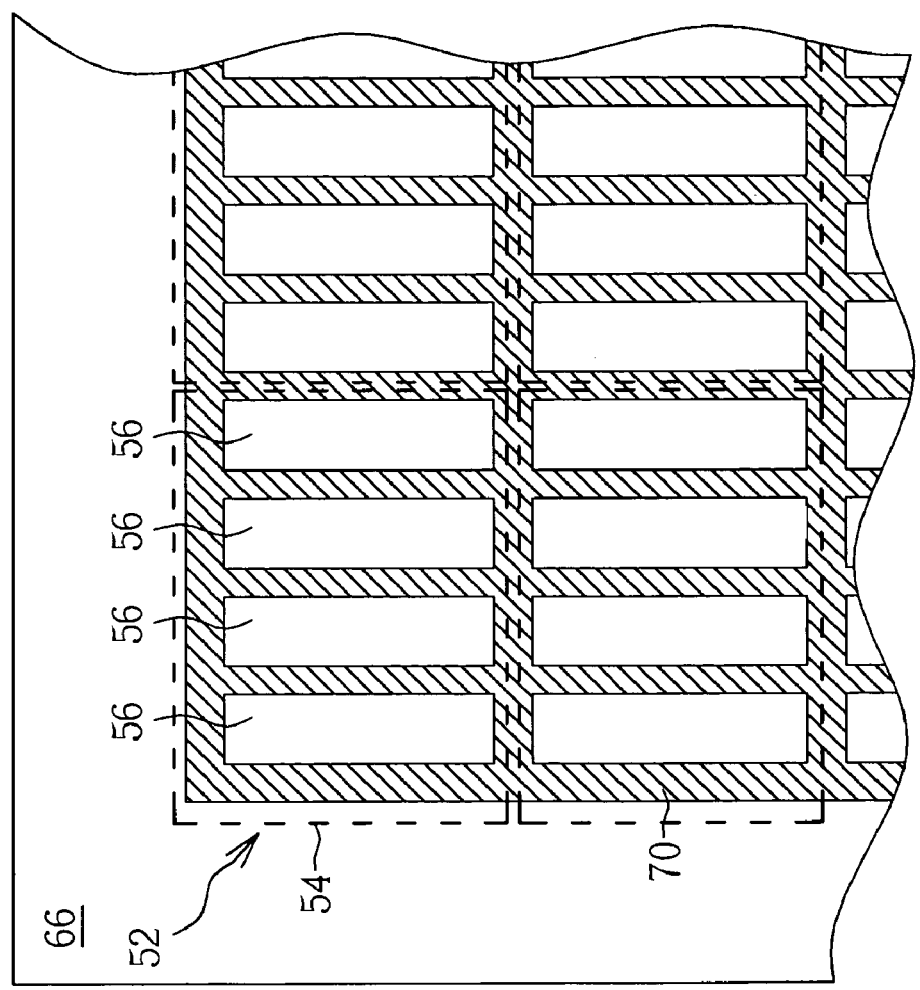
Figure 6:
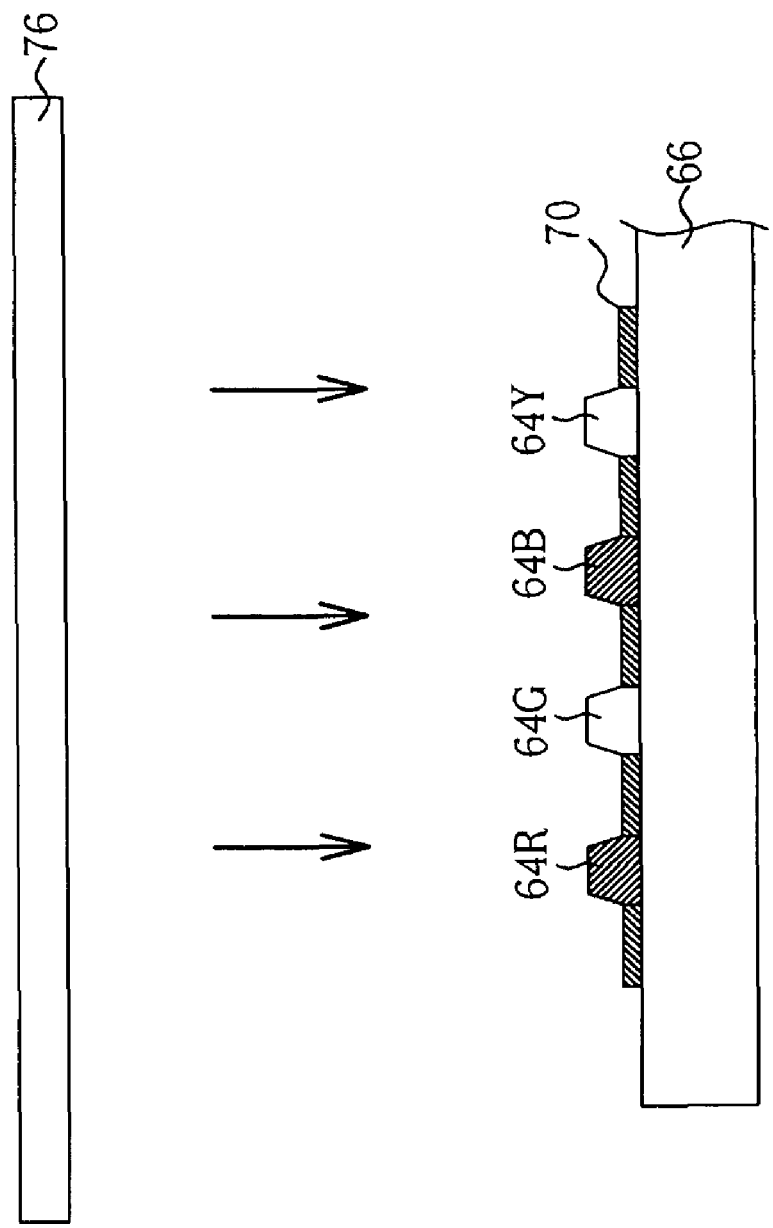
Figure 7:
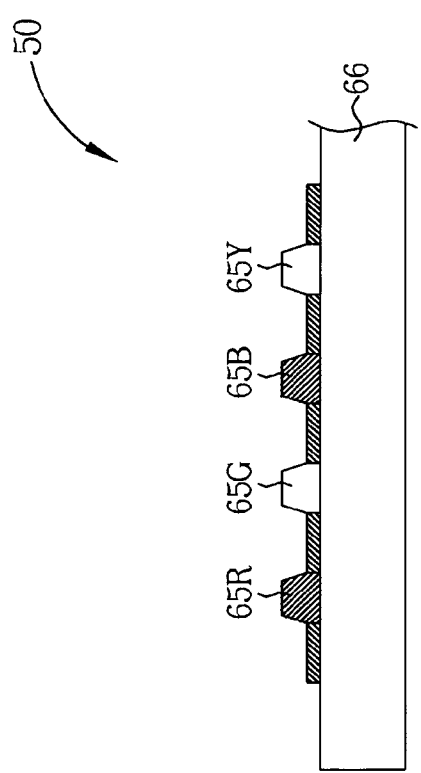
Figure 8:
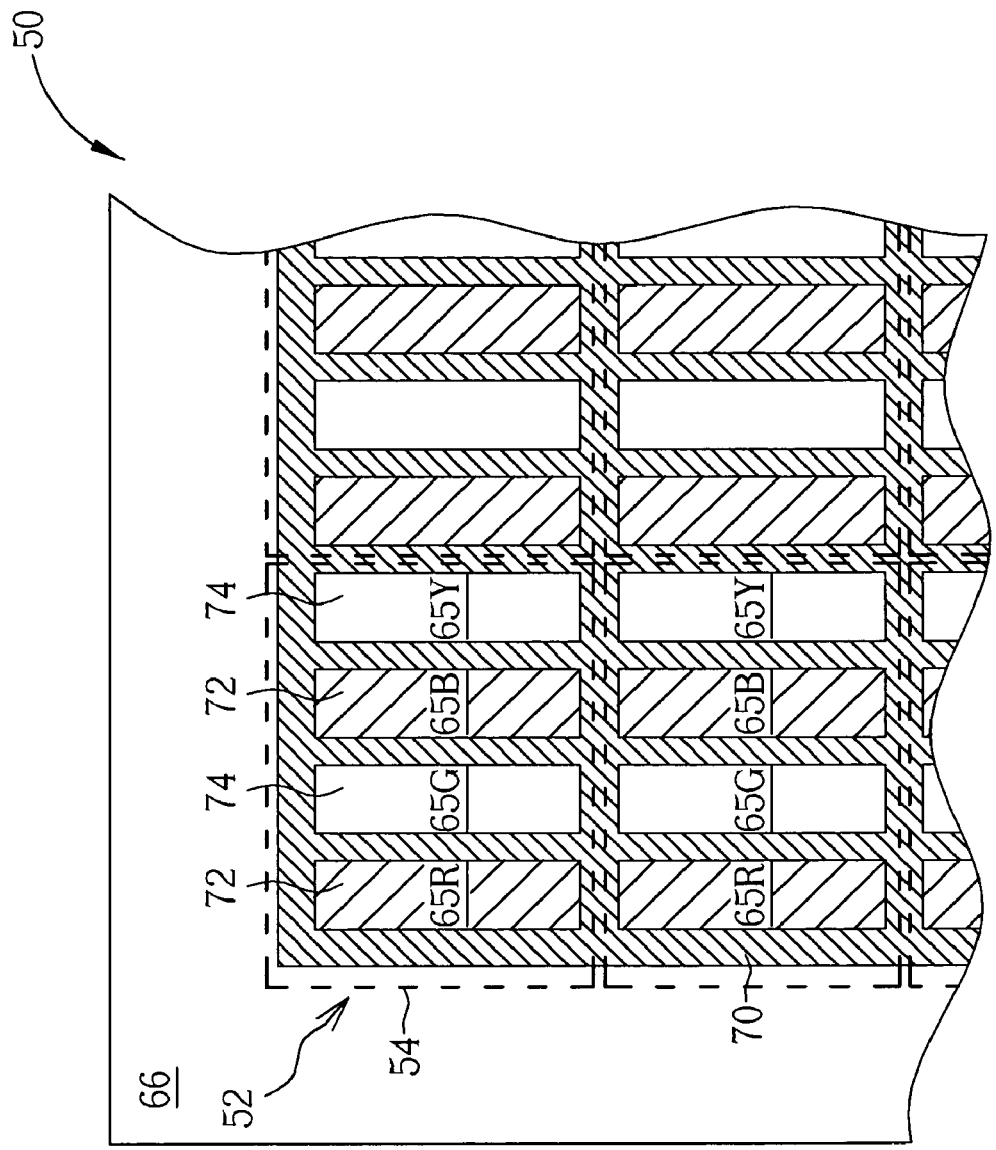

Please refer to FIG. 3 through FIG. 8, which are schematic diagrams illustrating a method of fabricating a color filter according to the first preferred embodiment of the present invention, where like numbered numerals designate similar or the same parts, regions or elements. FIG. 4 is a schematic top-view diagram illustrating the color filter shown in FIG. 3, and FIG. 8 is a schematic top-view diagram illustrating the color filter shown in FIG. 7. It is to be understood that the drawings are not drawn to scale and are served only for illustration purposes. As shown in FIG. 3, a substrate 66, such as a glass substrate, is first provided. The substrate 66 has a black matrix pattern 70 on its surface. The black matrix pattern 70 can be a shelter from improper reflecting light beams or improper refracting light beams to increase the contrast degree of display, and can also define a plurality of sub-pixel regions 56.

As shown in FIG. 4, a pixel array 52 is defined on the surface of the substrate 66. The pixel array 52 includes a plurality of the pixel regions 54 arranged as an array. In this embodiment, each pixel region 54 includes four sub-pixel regions 56, and the sub-pixel regions 56 of each pixel region 54 form a single row. In other words, the sub-pixel regions 56 can be arranged into an array having one row and four columns.

Figure 5:
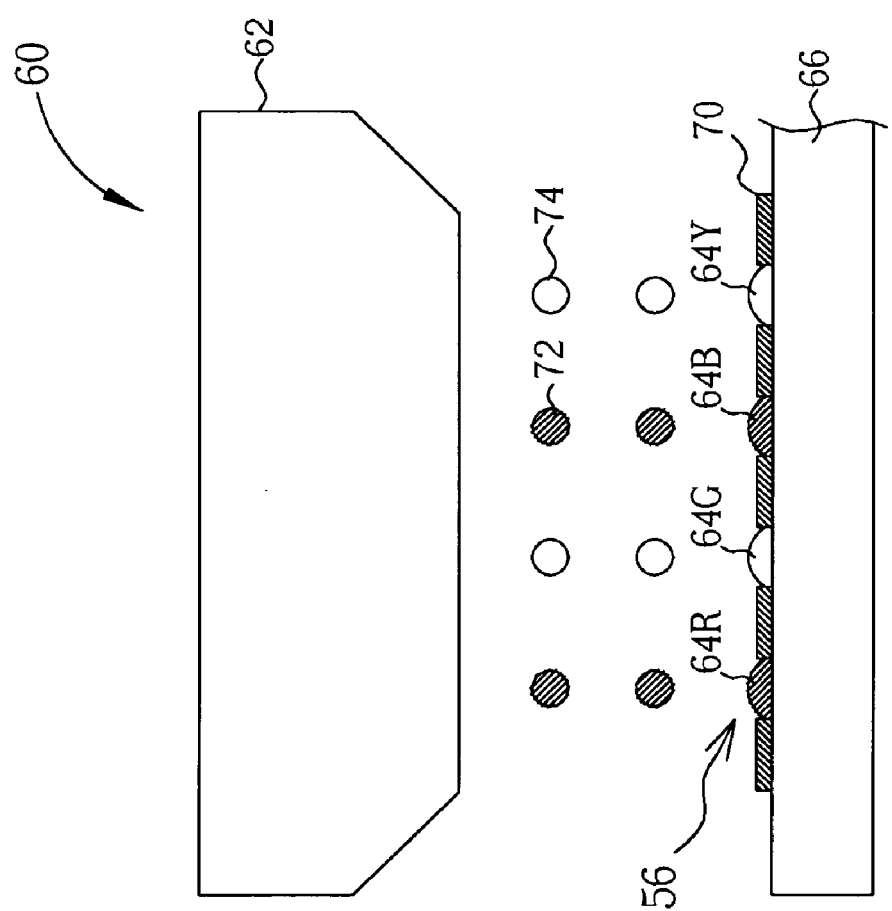

As shown in FIG. 5, the colored photoresist slurries with different colors are jetted to the corresponding sub-pixel regions 56 on the substrate 66 by utilizing ink-jet equipment 60. The ink-jet equipment 60 can include a plurality of nozzles 62 and a control device, which can supply the colored photoresist slurries and can control motions of the nozzles 62 (not shown in the drawings). It is noteworthy that the colored photoresist slurries disposed in odd-numbered columns are hydrophilic photoresists 72, and the colored photoresist slurries disposed in even-numbered columns are hydrophobic photoresists 74. The colored photoresist slurries can have various colors according to different types and needs of product display devices. For example, the colored photoresists disposed in each the pixel region 54 can be a red photoresist slurry 64R, a green photoresist slurry 64G, a blue photoresist slurry 64B and a yellow photoresist slurry 64Y from left to right respectively. In such a case, the red photoresist slurries 64R and the blue photoresist slurries 64B jetted on the substrate 66 can be the hydrophilic photoresists 72, while the green photoresist slurries 64G and the yellow photoresist slurries 64Y jetted on the substrate 66 can be the hydrophobic photoresists 74.

In this embodiment, the nozzles 62 are properly arranged so that the nozzles 62 can just correspond to the sub-pixel regions 56 respectively. Therefore, the red photoresist slurry 64R, the green photoresist slurry 64G, the blue photoresist slurry 64B and the yellow photoresist slurry 64Y can be jetted in the same ink-jet process. Because the hydrophilic photoresists 72 and the hydrophobic photoresist 74 are adjacent to each other, there are repulsions between the adjacent colored photoresist slurries, and overflows of colored photoresist slurries can therefore be prevented.

As shown in FIG. 6, a curing process is thereafter performed on the colored photoresist slurries to harden the colored photoresist slurries. For instance, a UV lamp 76 may be applied to radiate the colored photoresist slurries. Next, as shown in FIG. 7 and FIG. 8, a hard baking process is performed on the colored photoresist slurries. As a result, the red photoresist slurries 64R, the green photoresist slurries 64G, the blue photoresist slurries 64B and the yellow photoresist slurries 64Y can be turned into stable red photoresists 65R, stable green photoresists 65G, stable blue photoresists 65B and stable yellow photoresists 65Y respectively, and a color filter 50 is therefore fabricated. The thickness of the colored photoresist is about 2 micrometers (μm) after the hard baking process, and the thickness of the black matrix pattern 70 is about 1.2 micrometers.

Since the red photoresists 65R, the green photoresists 65G, the blue photoresists 65B and the yellow photoresists 65Y have repeating patterns of stripe disposition in this embodiment, the photoresists, which are needed to form the color filter, are merely red hydrophilic photoresists, green hydrophobic photoresists, blue hydrophilic photoresists and yellow hydrophobic photoresists. Accordingly, the color filter having a preferable color saturation can be simply fabricated without overflows of the colored photoresist slurries.

Figure 9:
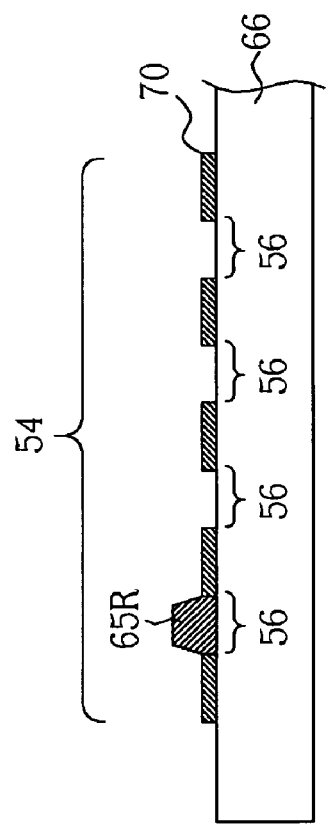
FIG. 9 through FIG. 10 are schematic diagrams illustrating a method of fabricating a color filter according to the second preferred embodiment of the present invention.

The method of fabricating a color filter should not be limited to the above-mentioned embodiment in the present invention. In other embodiments, the colored photoresist slurries with different colors can be formed individually. In other words, a photoresist slurry can under go a procedure, which includes an ink-jetting step, a curing step and a hard baking step, for each color. Please refer to FIG. 9 through FIG. 10, which are schematic diagrams illustrating a method of fabricating a color filter according to the second preferred embodiment of the present invention, where like numbered numerals designate similar or the same parts, regions or elements. As shown in FIG. 9, the hydrophilic photoresist slurries with red color are first jetted to the sub-pixel regions 56 in the first column of each pixel region 54. Substantially, a curing process is performed on the red photoresist slurries, and next a hard baking process is carried out on the red photoresist slurries to form a plurality of stable red photoresists 65R on the substrate 66.

Figure 10:
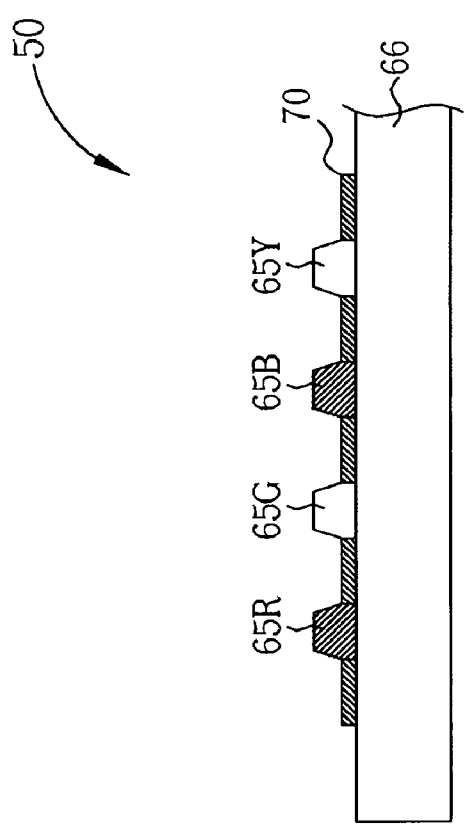

Thereafter, as shown in FIG. 10, a procedure, which includes an ink-jetting step, a curing step and a hard baking step, can be performed for each color individually to form hydrophobic green photoresists 65G, hydrophilic blue photoresists 65B and hydrophobic yellow photoresists 65Y in the corresponding sub-pixel regions 56 in turn, and a color filter 50 is therefore fabricated. It should be understood to those skilled in this art that the above-mentioned forming order of the colored photoresists can be adjusted according to the process conditions or the product requirements. For instance, the blue photoresists 65B can be first formed, and next red photoresists 65R, the green photoresists 65G and the yellow photoresists 65Y are formed in turn.

One characteristic of the present invention is that the color filter includes both the hydrophilic photoresists 72 and the hydrophobic photoresist 74, and that the hydrophilic photoresists 72 and the hydrophobic photoresist 74 are adjacent to each other. Since the hydrophilic photoresists 72 and the hydrophobic photoresist 74 are adjacent to each other, there are repulsions between the adjacent colored photoresist slurries, and overflows of colored photoresist slurries can be prevented. In order to provide the repulsion, a material of the hydrophile photoresists 72 can contain at least a hydrophile group and no hydrophobic group, while the hydrophobic photoresist 74 can contain at least a hydrophobic group and no hydrophile group. Generally speaking, a material of the hydrophile photoresists 72 can contain a polar group or an ionic group, such as an ether group, a hydroxyl group, a carboxyl group or an amino group. In other words, the materials of the hydrophile photoresists 72 can have the chemical formula as R—O—R, R—OH, R—COOH or R—NH, where the letter "R" usually stands for the alkyl group or other organic groups. On other hand, the hydrophobic groups are usually non-polar groups, such as a long-chain hydrocarbon group containing 8-20 carbon atoms. For example, the hydrophobic groups can contain a long-chain hydrocarbon group, an alcohol group containing plenty of carbon atoms, a phenyl group, an ester group, or a polypropylene group.

Figure 11:
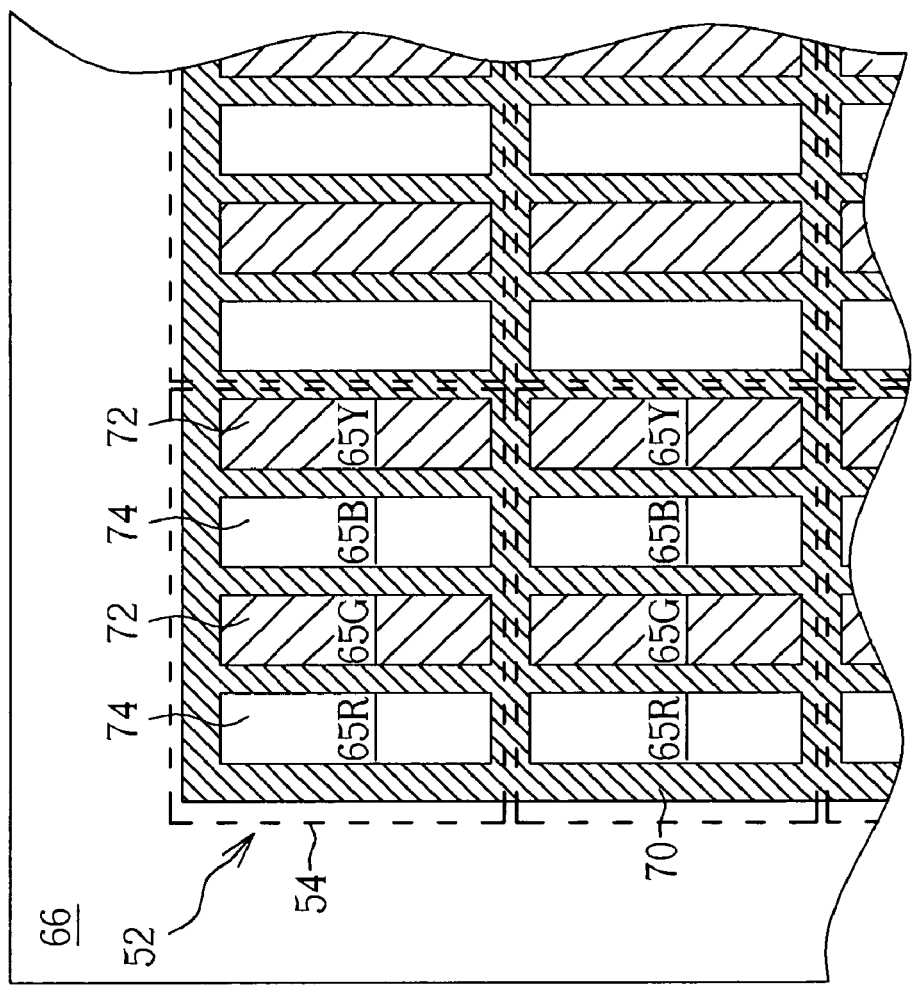
FIG. 11 through FIG. 14 are top-view schematic diagrams illustrating color filters according to the third and sixth preferred embodiments of the present invention respectively.
Figure 12:
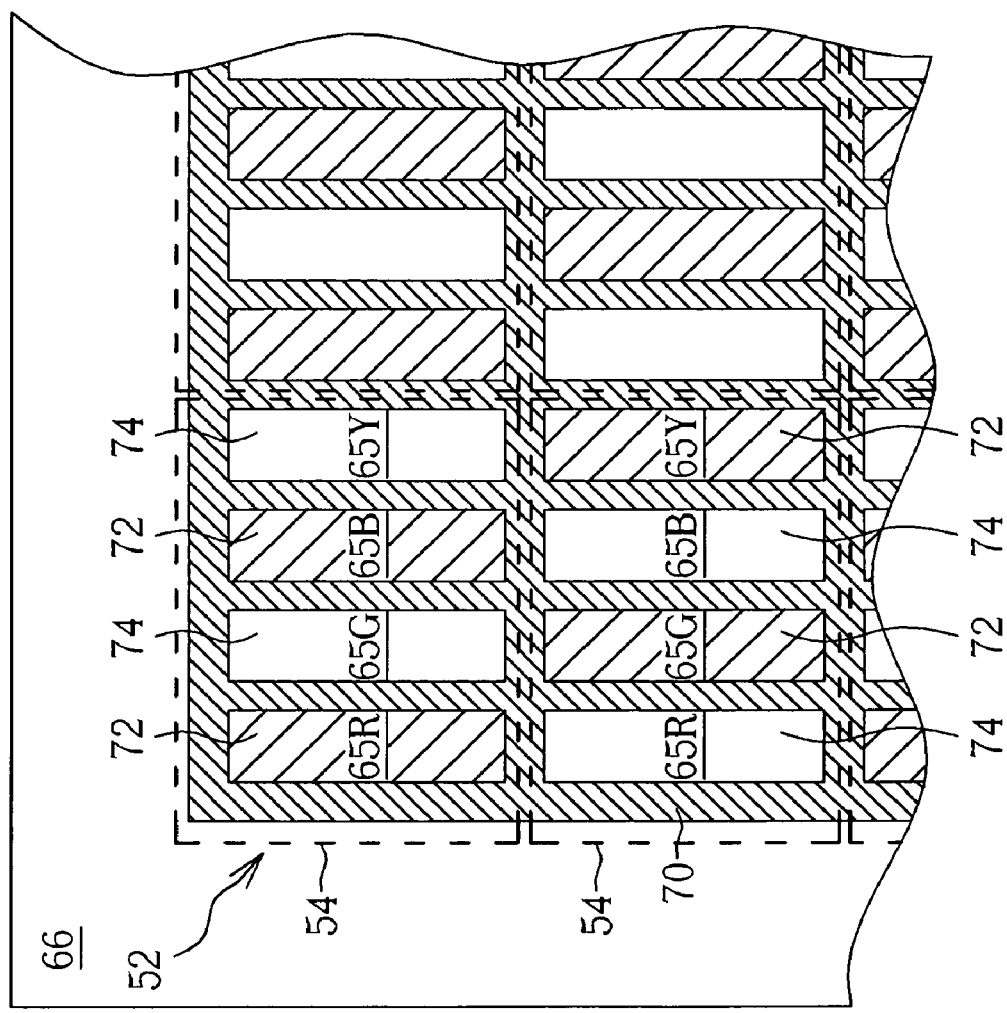

In addition, the arrangements of the hydrophilic photoresists 72 and the hydrophobic photoresist 74 should not be limited to the above-mentioned embodiments in the present invention. Please refer to FIG. 11 and FIG. 12, which are top-view schematic diagrams illustrating color filters according to the third and fourth preferred embodiments of the present invention respectively, where like numbered numerals designate similar or the same parts, regions or elements. As shown in FIG. 11 and FIG. 12, the colored photoresists positioned in each pixel region 54 are a red photoresist 65R, a green photoresist 65G, a blue photoresist 65B and a yellow photoresist 65Y from left to right. Different from the above-mentioned embodiments, the red photoresists 65R and the blue photoresists 64B disposed in the odd-numbered columns can be the hydrophilic photoresists 72, while the green photoresists 65G and the yellow photoresists 65Y disposed in the even-numbered columns can be the hydrophobic photoresists 74 in the third embodiment.

In another embodiment, as shown in FIG. 12, the red photoresists 65R and the blue photoresists 65B can be the hydrophilic photoresists 72 for the pixel regions 54 positioned in the odd-numbered rows, while the green photoresists 65G and the yellow photoresists 65Y can be the hydrophobic photoresists 74. Simultaneously, the red photoresists 65R and the blue photoresists 65B can be the hydrophobic photoresists 74 for the pixel regions 54 positioned in the even-numbered rows, while the green photoresists 65G and the yellow photoresists 65Y can be the hydrophilic photoresists 72. Thus, there are repulsions among all the adjacent colored photoresists in two dimensions.

Figure 13:
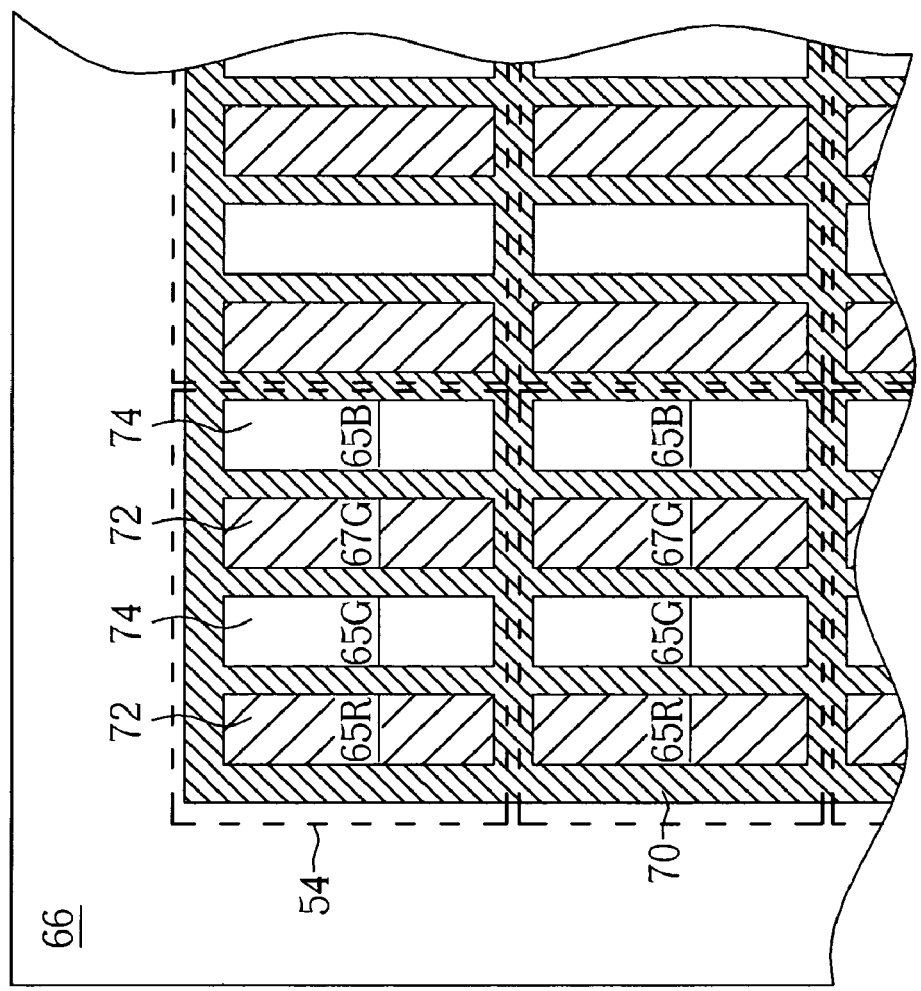
Figure 14:
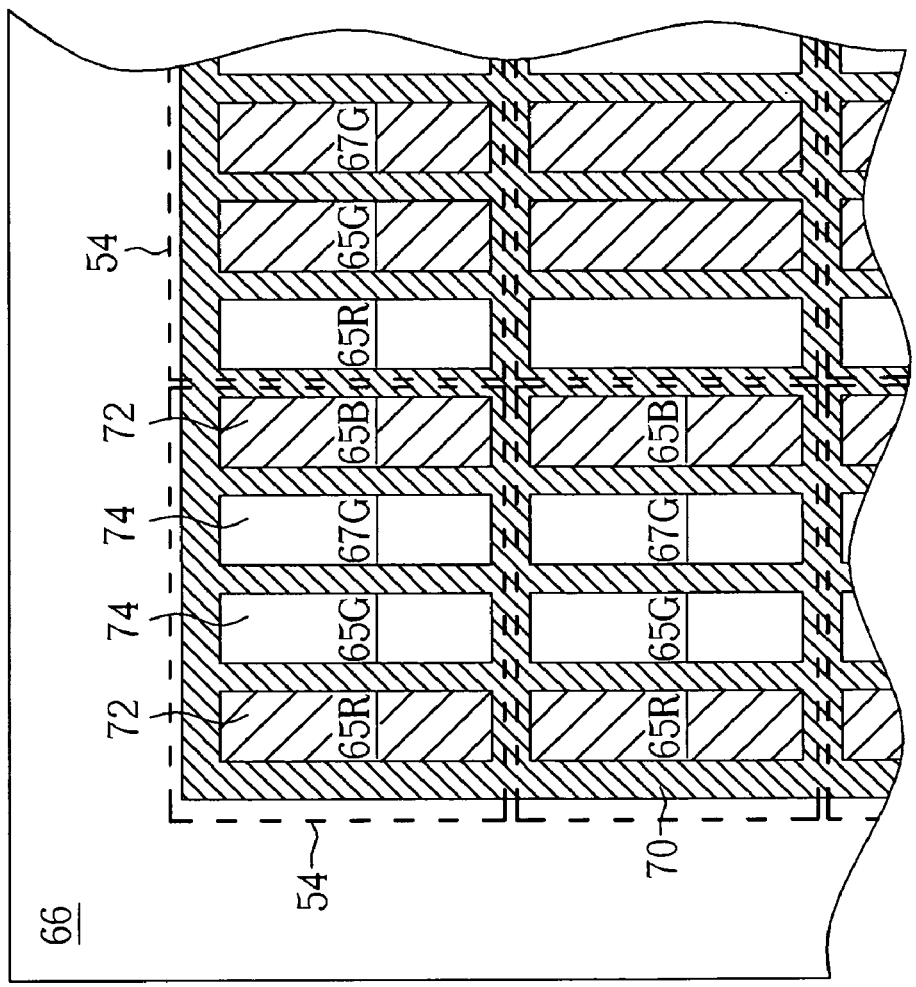

On the other hand, the hue arrangement of the color filter can be adjusted in the present invention. Please refer to FIG. 13 and FIG. 14, which are top-view schematic diagrams illustrating color filters according to the fifth and sixth preferred embodiments of the present invention respectively, where like numbered numerals designate similar or the same parts, regions or elements. As shown in FIG. 13 and FIG. 14, different from the above-mentioned embodiments, the colored photoresists positioned in each pixel region 54 are a red photoresist 65R, a green photoresist 65G, a green photoresist 67G and a blue photoresist 65B from left to right. In FIG. 13, the red photoresists 65R and the green photoresists 67G disposed in the odd-numbered columns can be the hydrophilic photoresists 72, while the green photoresists 65G and the blue photoresists 65 disposed in the even-numbered columns can be the hydrophobic photoresists 74 in the fifth embodiment.

Since the red photoresists 65R, the green photoresists 65G, the green photoresist 67G and the blue photoresists 65B have repeating patterns of stripe disposition in this embodiment, the photoresists, which are needed to form the color filter, are merely red hydrophilic photoresists, green hydrophobic photoresists, green hydrophilic photoresists and blue hydrophobic photoresists. Accordingly, the color filter having a preferable color saturation can be simply fabricated without overflows of the colored photoresist slurries.

In FIG. 14, the red photoresists 65R and the blue photoresists 65B can be the hydrophilic photoresists 72 for the pixel regions 54 positioned in the odd-numbered columns, while the green photoresists 65G and the green photoresists 67G can be the hydrophobic photoresists 74. Simultaneously, the red photoresists 65R and the blue photoresists 65B can be the hydrophobic photoresists 74 for the pixel regions 54 positioned in the even-numbered columns, while the green photoresists 65G and the green photoresists 67G can be the hydrophilic photoresists 72.

Figure 15:
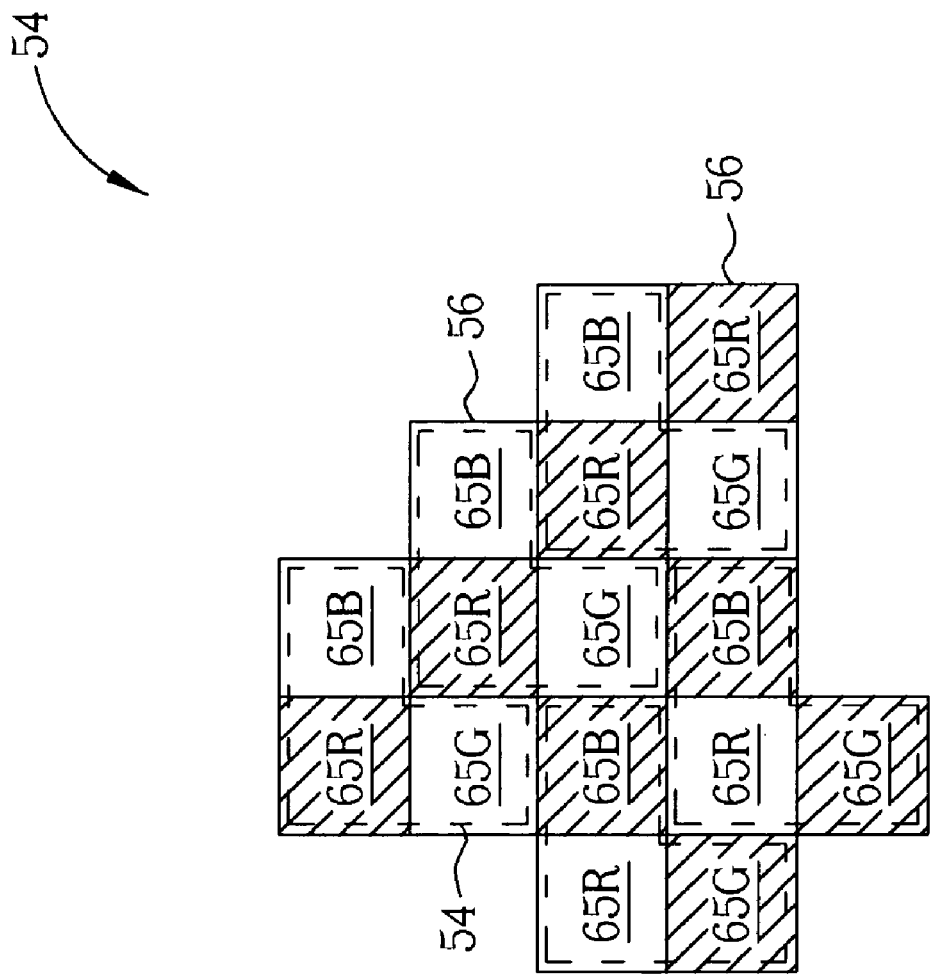
FIG. 15 through FIG. 18 are top-view schematic diagrams illustrating pixel regions 54 according to the seventh through tenth preferred embodiments of the present invention respectively.
Figure 16:
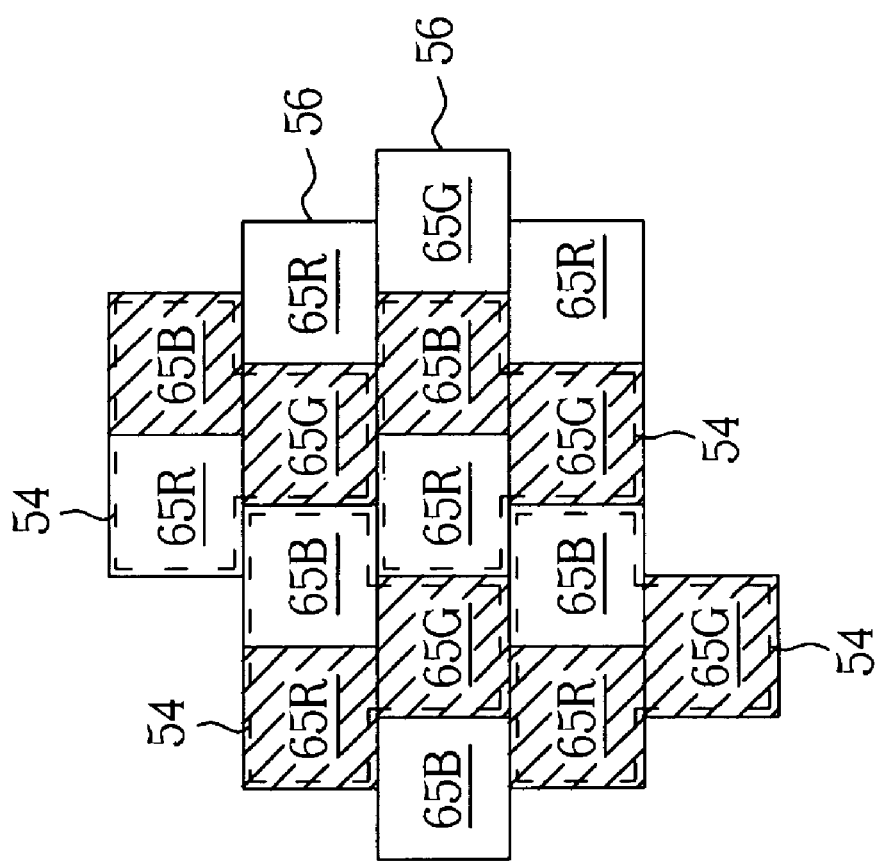

In addition, the arrangement of the sub-pixel regions 56 is variable. Please refer to FIG. 15 through FIG. 18, which are top-view schematic diagrams illustrating pixel regions 54 according to the seventh through tenth preferred embodiments of the present invention respectively. As shown in FIG. 15 and FIG. 16, each pixel region 54 can include three sub-pixel regions 56 in the seventh and the eighth preferred embodiments. In the seventh embodiment, the sub-pixel regions 56 and the related photoresists have repeating patterns of mosaic disposition. Thus, the sub-pixel regions 56 are arranged as an array, and the photoresists having the same color can be arranged in a line along the direction of the diagonal line. In the eighth embodiment, the sub-pixel regions 56 and the related photoresists have repeating patterns of triangle disposition. That is to say, the sub-pixel regions 56 are staggered to the sub-pixel regions 56 disposed in the adjacent rows, and one sub-pixel region 56 can therefore adjoin six sub-pixel regions 56 at once. In the seventh and the eighth preferred embodiments, the colored photoresists disposed in odd-numbered rows and odd-numbered columns, and the colored photoresists disposed in even-numbered rows and even-numbered columns can be the hydrophile photoresists 72. Simultaneously, the colored photoresists disposed in odd-numbered rows and even-numbered columns, and the colored photoresists disposed in even-numbered rows and odd-numbered columns can be the hydrophobic photoresists 74.

Figure 17:
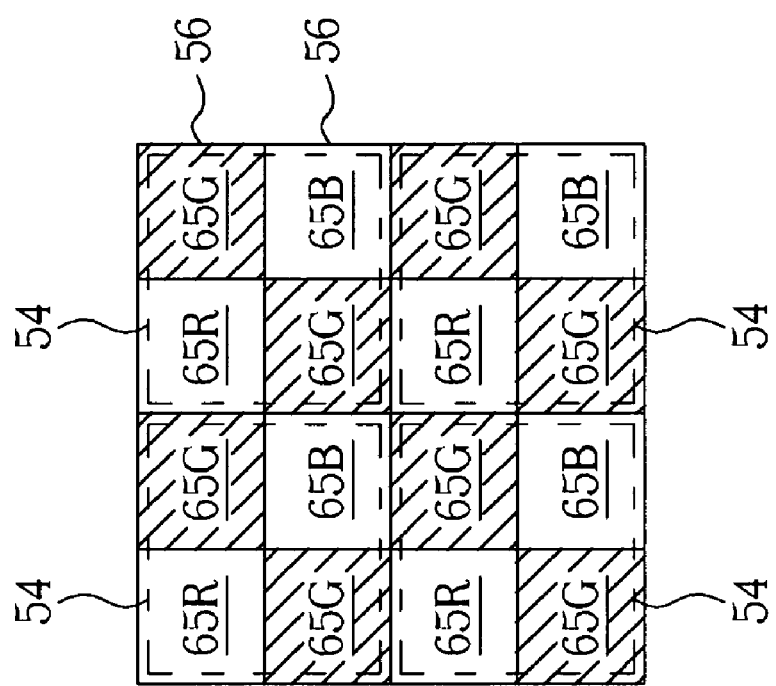

As shown in FIG. 17, the sub-pixel regions 56 and the related photoresists have repeating patterns of four-pixel disposition in the ninth embodiment. In other words, each pixel region 54 can include four sub-pixel regions 56, and these four sub-pixel regions 56 can be arranged as a two dimension array. The red photoresists 65R disposed in odd-numbered rows and odd-numbered columns, and the blue photoresists 65B disposed in even-numbered rows and even-numbered columns can be the hydrophobic photoresists 74. The green photoresists 65G disposed in odd-numbered rows and even-numbered columns, and the green photoresists 65G disposed in even-numbered rows and odd-numbered columns are the hydrophile photoresists 72.

Figure 18:
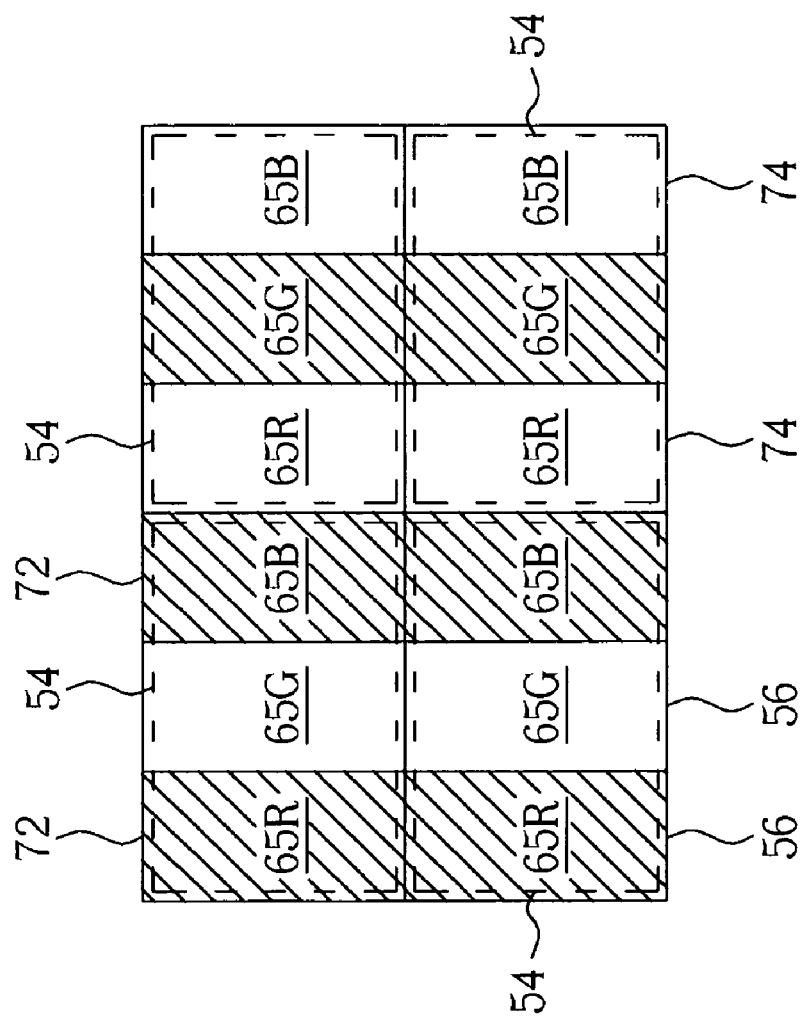

As shown in FIG. 18, each pixel region 54 includes three sub-pixel regions 56, and the sub-pixel regions 56 of each pixel region 54 form a single row in the tenth embodiment. The colored photoresists positioned in each pixel region 54 are a red photoresist 65R, a green photoresist 65G and a blue photoresist 65B from left to right. The photoresists disposed in the odd-numbered columns can be the hydrophilic photoresists 72, while the photoresists disposed in the even-numbered columns can be the hydrophobic photoresists 74 so that the hydrophile photoresists 72 and the hydrophobic photoresists 74 can be alternately arranged.

The color filter of the present invention can be applied to various color display devices, such as a polymer light emitting diode (PLED) display or a TFT-LCD. The pixel regions of the color filter can correspond to the pixels of the related color display device so the white light provided in the display can be turned into lights having the needed colors. In other words, the color filter of the present invention can be applied in various products which have a display device, such as a personal digital assistant (PDA), a notebook, a desktop computer, a LCD TV or a cellular phone, etc.

Comparing with the tradition method of fabricating a color filter by a spin coating process, the present invention can increase the utilization percentage of the colored photoresist slurry and reduces material cost. Furthermore, one single ink-jet equipment can form the colored photoresists in the present invention, so a large number of exposing equipments, a large number of developing equipments and a large number of photo masks are not necessary and can be omitted. Therefore, the process and the equipments are simplified. On the other hand, since the hydrophilic photoresists and the hydrophobic photoresist are adjacent to each other, there are repulsions among the adjacent colored photoresist slurries, and overflows of colored photoresist slurries can be prevented in the present invention. Comparing with the conventional method of fabricating a color filter by an ink-jet process, the pollution from other colored photoresists can be avoided in a color filter, the fabricating yield of color filters can be increased, and a greater exhibition of the color display device are available in the present invention.

Those skilled in the art will readily observe that numerous modifications and alterations of the device and method may be made while retaining the teachings of the invention.

What is claimed is:

1. A color filter, comprising:
   a substrate;
   a plurality of pixel regions disposed on the substrate, each of the pixel regions comprising a plurality of sub-pixel regions; and
   a plurality of colored photoresists disposed in the sub-pixel regions correspondingly, wherein the colored photoresists comprise a plurality of hydrophile photoresists and a plurality of hydrophobic photoresists, the hydrophile photoresists and the hydrophobic photoresists are alternately arranged, and wherein in a row direction, the hydrophile photoresist is adjacent to two hydrophobic photoresists, and the hydrophobic photoresist is adjacent to two hydrophile photoresists.

2. The color filter of claim 1, wherein each of the pixel regions comprises four sub-pixel regions, and the sub-pixel regions of each of the pixel regions form a single row.

3. The color filter of claim 2, wherein the colored photoresists disposed in the sub-pixel regions of each of the pixel regions are a red photoresist, a green photoresist, a blue photoresist and a yellow photoresist from left to right respectively.

4. The color filter of claim 3, wherein the red photoresists and the blue photoresists are the hydrophile photoresists, and the green photoresists and the yellow photoresists are the hydrophobic photoresists.

5. The color filter of claim 3, wherein the green photoresists and the yellow photoresists are the hydrophile photoresists, and the red photoresists and the blue photoresists are the hydrophobic photoresists.

6. The color filter of claim 2, wherein the colored photoresists disposed in the sub-pixel regions of each of the pixel regions are a red photoresist, a first green photoresist, a second green photoresist and a blue photoresist from left to right respectively.

7. The color filter of claim 6, wherein the red photoresists and the second green photoresists are the hydrophile photoresists, and the first green photoresists and the blue photoresists are the hydrophobic photoresists.

8. The color filter of claim 6, wherein the first green photoresists and the blue photoresists are the hydrophile photoresists, and the red photoresists and the second green photoresists are the hydrophobic photoresists.

9. The color filter of claim 1, wherein each of the pixel regions comprises four sub-pixel regions, and the sub-pixel regions of each of the pixel regions are arranged as a two dimension array.

10. The color filter of claim 9, wherein the colored photoresists disposed in odd-numbered rows and odd-numbered columns, and the colored photoresists disposed in even-numbered rows and even-numbered columns are the hydrophobic photoresists.

11. The color filter of claim 10, wherein the colored photoresists disposed in odd-numbered rows and even-numbered columns, and the colored photoresists disposed in even-numbered rows and odd-numbered columns are the hydrophile photoresists.

12. The color filter of claim 1, wherein each of the pixel regions comprises three sub-pixel regions, and the colored photoresists disposed in the sub-pixel regions of each of the pixel regions are a red photoresist, a green photoresist and a blue photoresist respectively.

13. The color filter of claim 12, wherein the red photoresists, the green photoresists and the blue photoresists are arranged in a triangular pattern.

14. The color filter of claim 12, wherein the red photoresists, the green photoresists and the blue photoresists are arranged in a mosaic pattern.

15. The color filter of claim 12, wherein the red photoresist, the green photoresist and the blue photoresist form a single row in each of the pixel regions.

16. The color filter of claim 1, wherein a material of the hydrophile photoresists comprises a polar group or an ionic group.

17. The color filter of claim 1, wherein a material of the hydrophile photoresists comprises an ether group, a hydroxyl group, a carboxyl group or an amino group.

18. The color filter of claim 1, wherein a material of the hydrophobic photoresists comprises a long-chain hydrocarbon group, and the long-chain hydrocarbon group comprises 8-20 carbon atoms.

19. A method of fabricating a color filter, comprising:
    providing a substrate, the substrate comprising a plurality of pixel regions thereon, and each of the pixel regions comprising a plurality of sub-pixel regions; and
    forming a colored photoresist in each of the sub-pixel regions, the colored photoresists comprising a plurality of hydrophile photoresists and a plurality of hydrophobic photoresists, wherein the hydrophile photoresists and the hydrophobic photoresists are alternately arranged, and wherein in a row direction, the hydrophile photoresist is adjacent to two hydrophobic photoresists, and the hydrophobic photoresist is adjacent to two hydrophile photoresists.

20. The method of claim 19, wherein the colored photoresists comprise a plurality of first color photoresists and a plurality of second color photoresists.

21. The method of claim 20, wherein the first color photoresists are the hydrophile photoresists, and the second color photoresists are the hydrophobic photoresists.

22. The method of claim 21, wherein the step of forming the colored photoresists comprises:
    performing an ink jet process to jet out a plurality of first color slurries and a plurality of second color slurries to the sub-pixel regions;
    performing an ultraviolet (UV) curing process on the first color slurries and the second color slurries; and
    performing a hard baking process on the first color slurries and the second color slurries to form the first color photoresists and the second color photoresists.

23. The method of claim 21, wherein the step of forming the colored photoresists comprises:
    performing an ink jet process to jet out a plurality of first color slurries to the sub-pixel regions;

performing a first UV curing process on the first color slurries;

performing a first hard baking process on the first color slurries to form the first color photoresists;

performing a second ink jet process to jet out a plurality of second color slurries to the sub-pixel regions;

performing a second UV curing process on the second color slurries; and performing a second hard baking process on the second color slurries to form the second color photoresists.

* * * * *